United States Patent
Feldtkeller et al.

(10) Patent No.: US 6,858,895 B2
(45) Date of Patent: Feb. 22, 2005

(54) CIRCUIT CONFIGURATION HAVING A FIELD-EFFECT TRANSISTOR OPERABLE AT HIGHER FREQUENCIES

(75) Inventors: Martin Feldtkeller, München (DE); Walter Rieger, Arnoldstein (AT); Wolfgang Friesacher, St. Michael (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/390,870

(22) Filed: Mar. 17, 2003

(65) Prior Publication Data

US 2003/0173619 A1 Sep. 18, 2003

(30) Foreign Application Priority Data

Mar. 15, 2002 (DE) .......................................... 102 11 543

(51) Int. Cl.[7] .............................................. H01L 29/76
(52) U.S. Cl. ....................................... 257/330; 257/332
(58) Field of Search ................................ 257/330–333, 257/133–135, 260–262

(56) References Cited

U.S. PATENT DOCUMENTS

| | | |
|---|---|---|
| 5,561,393 A | 10/1996 | Sakurai et al. |
| 5,585,650 A | 12/1996 | Kumagai |
| 6,566,708 B1 * | 5/2003 | Grover et al. .............. 257/330 |

FOREIGN PATENT DOCUMENTS

| | | |
|---|---|---|
| DE | 195 28 998 A1 | 2/1996 |
| DE | 100 38 177 A1 | 2/2002 |

* cited by examiner

Primary Examiner—Dung A. Le
(74) Attorney, Agent, or Firm—Laurence A. Greenberg; Werner H. Stemer; Ralph E. Locher

(57) ABSTRACT

A circuit configuration for the switch-on/off control of a DMOS power transistor has at least one first gate electrode and, separate from the latter, a second gate electrode, which are capacitively coupled to one another by a capacitance distributed over the field-effect transistor and which can be driven via separate external gate electrode terminals. The circuit configuration has two individual driver circuits and a generating circuit in order to feed a first drive signal to the first gate electrode and a second drive signal to the second gate electrode, the second drive signal being delayed with respect to the first drive signal.

8 Claims, 4 Drawing Sheets

CIRCUIT CONFIGURATION HAVING A FIELD-EFFECT TRANSISTOR OPERABLE AT HIGHER FREQUENCIES

BACKGROUND OF THE INVENTION

Field of the Invention

The invention relates to a circuit configuration having a field-effect transistor and a driver configuration therefore, and to a method for the switch-on/off control of a field-effect transistor, in particular power field-effect transistor, by which the maximum operating frequency of the field-effect transistor can be increased.

When DMOS power transistors are switched on and off, the so-called Miller plateau arises due to the feedback capacitance between the gate and the drain, almost the entire power loss being generated during the Miller plateau. As a result, the power loss is virtually proportional to the number of switch-on and -off cycles per time. The longer the Miller plateau, the lower the maximum operating frequency. However, future applications demand field-effect power transistors having a higher operating frequency.

In order to reduce the switching losses of a MOS power transistor, the geometrical dimensions of the transistor are normally optimized in such a way that its gate-drain capacitance is minimized. As a result, it is possible to shorten the Miller phase during a switching operation. In the case of lateral DMOS transistors, for this purpose the poly-web can be reduced in size or an oxide that is significantly thicker than the gate oxide can be used in the gate-drain overlap region. In the case of trench transistors, in which the gate electrode is embedded in an insulated manner in a deep trench in the semiconductor body, the immersion depth of the trench into the region of the semiconductor body is minimized in the prior art.

Published, Non-Prosecuted Patent Application DE 100 38 177 A describes a new possibility for minimizing the gate-drain capacitance. This is done by a second control or gate electrode, and the patent application proposes connecting the further control electrode preferably to a source potential and insulating it by a surrounding oxide.

Customary drive circuits for DMOS power transistors are optimized toward charging a gate electrode as rapidly as possible to a high voltage with respect to the source electrode voltage and discharging it as rapidly as possible to the source potential. In particular, the on resistances of the driver transistors and the gate bulk resistance of the power MOS are important optimization parameters in this case. Circuits which are customary in the driving of insulated gate bipolar transistors and which provide a negative gate voltage for the switch-off are too expensive for MOSFET drives. However, an increase in the switching speed can be achieved by such drive circuits.

Standard power MOSFETs require a gate voltage of 10 V for a low on resistance, while a gate voltage of 5 V to 6 V suffices for logic level transistors. The Miller plateau is at about 4 V or 2.5 V. A large part of the gate charge has to be applied or removed at this gate voltage. In the case of logic level transistors, the input capacitance is higher by the same factor and the total gate charge to be applied is virtually identical in both components. Logic level transistors are disadvantageous with regard to the switching speed because, given the same gate bulk resistance and a smaller voltage difference, less current can flow via the gate bulk resistance in order to build up or dissipate the same gate charge.

However, driver circuits for 5 V to 6 V are technologically easier to realize and faster than driver circuits for 10 V. As a result, the advantage of normal level transistors is partly qualified.

SUMMARY OF THE INVENTION

It is accordingly an object of the invention to provide a circuit configuration and a method for the switch-on/off control of a field-effect transistor that overcome the above-mentioned disadvantages of the prior art devices and methods of this general type, in which the Miller phase disappears virtually completely and the maximum operating frequency of the component can be significantly increased.

With the foregoing and other objects in view there is provided, in accordance with the invention, a circuit configuration having a field-effect transistor. The circuit configuration contains a semiconductor body having a trench formed therein, external gate terminals, including a first gate terminal and a second gate terminal, at least one source electrode region formed in the semiconductor body, at least one drain electrode region formed in the semiconductor body, and at least two gate electrodes, including a first gate electrode and a second gate electrode, formed vertically in the trench and in a manner insulated from one another and from the source electrode region and the drain electrode region. The first and second gate electrodes are capacitively coupled to one another by a capacitance distributed over the field-effect transistor. The gate electrodes are each connected separately to one of the external gate terminals. A driver configuration is connected to the external gate terminals and has driver circuits, including a first driver circuit and a second driver circuit, and a generating device. The driver configuration generates a first gate drive signal passed to the first gate terminal, and a second gate drive signal passed to the second gate terminal. The generating device generates the second gate drive signal in a delayed manner with respect to the first gate drive signal.

Accordingly, the circuit configuration according to the invention and the method according to the invention are used for a power MOSFET having two capacitively coupled gate electrodes, in the case of which the coupling capacitance is distributed over the chip of the power MOSFET. As a result, the coupling capacitance is electrically closer to the MOSFET cells than the gate bulk resistance. What is essential in the case of a MOSFET of this type is that, unlike in the case of the DMOS power transistors proposed in the above patent application, the two gate electrodes are connected separately to external gate terminals of the component, and that there is not one gate electrode that is fixedly connected to the source potential.

In accordance with a first essential aspect, a circuit configuration which achieves the above object, has a field-effect transistor, in particular power field-effect transistor, with at least one source electrode region and at least one drain electrode region and at least one first and second gate electrode, which are formed vertically in a deep trench—formed in a semiconductor body—and in a manner insulated from one another and from the source electrode region and the drain electrode region and are capacitively coupled to one another by a capacitance distributed over the field-effect transistor. The circuit configuration further has a driver configuration and, is distinguished, according to the invention, by the fact that the two gate electrodes are connected separately to external gate terminals of the field-effect transistor, and that the driver configuration has a first and second driver circuit and a generating device in each case for generating a first gate drive signal, which is passed to the first gate terminal, and a second gate drive signal which is passed to the second gate terminal. The generating device generates the second gate drive signal in a delayed manner with respect to the first gate drive signal.

The first gate electrode, which forms the channel in the MOSFET, is first charged or discharged by the circuit configuration. The gate voltage initially changes relatively rapidly on account of the gate current, but the voltage change slows down on account of the Miller effect as soon as the drain voltage begins to change. From this point in time, the charge reversal operation is supported by a charging or discharging—brought about by the circuit configuration according to the invention—of the second gate electrode which is capacitively coupled to the first gate electrode. In contrast to the first gate electrode, in the case of which at most the difference between the Miller plateau voltage and the drive voltage is available as the voltage drop across the gate bulk resistance, at the second gate the entire drive voltage can still be utilized as a voltage drop across the bulk resistance of the second gate. In contrast to an external capacitive coupling of the two gate drive signals by a discrete capacitor, which coupling is likewise possible but is not proposed by the invention, the risk of the voltage across a transistor of the driver circuits being reversed does not arise in the case of a divided coupling capacitance.

In a first exemplary embodiment, the generating device has a delay element, and the delay time brought about by the delay element for the second gate drive signal with respect to the first gate drive signal is chosen in accordance with a respective field-effect transistor type.

In an alternative second exemplary embodiment, the generating device likewise has a delay element and the delay time of the second gate drive signal which is brought about by it with respect to the first gate drive signal is defined in such a way that the driving of the second gate electrode which is brought about by the second gate drive signal begins if the internal gate voltage of the first gate electrode has reached the Miller plateau.

In accordance with a further alternative exemplary embodiment, the circuit configuration according to the invention has a detection device which detects either the negative drain voltage edge which occurs when the Miller plateau is reached at the first gate electrode, or the current flow induced in the second gate electrode when the first gate drive signal is applied to the first gate electrode, and generates a trigger signal, with the result that the generating device, driven by the trigger signal, generates the second gate drive signal either directly in response to the detected negative drain voltage edge or directly in response to the current flow in the second gate electrode detected by the detection device.

In the exemplary embodiment, the reduction of the Miller plateau during switch-off is achieved in that the gate drive signal is ended in response either to the detection of the positive drain voltage edge or to the detection of the current flow induced in this case in the second gate electrode and reverts to the source potential.

In a further exemplary embodiment, the first and second gate drive signals are generated with rectangular waveforms.

In a further alternative exemplary embodiment, the first gate drive signal may be generated with a staircase waveform and the second gate drive signal may be generated with a rectangular waveform. The first and second driver circuits and the generating device may either be located outside the housing of the power field-effect transistor or be accommodated together with the power field-effect transistor in a housing. The outlay for the additional gate terminal can thereby be kept down. The invention is also suitable for the monolithic integration of the driver circuit, the generating device and power MOSFET.

In accordance with a second essential aspect, a method—which achieves the above object—for operating a circuit configuration having a field-effect transistor is now described. The invention is characterized, in that the driver configuration separately generates a first and second gate drive signal and applies them to separate gate terminals in each case for the first and second gate electrodes. The second gate drive signal is generated in a delayed manner with respect to the first gate drive signal and is applied to the second gate terminal in a delayed manner.

A further use for the power MOSFET provided with the drive circuit according to the invention and having two gate electrodes which are capacitively coupled by a coupling capacitance distributed over the chip of the power MOSFET and are isolated from one another and can be driven separately emerges in conjunction with German Patent DE 44 42 466 C1, which describes a linear voltage regulator with a power MOSFET as an actuator and with a capacitive coupling. If the coupling capacitance is distributed in the component, as in the case of the power MOSFET used in the case of the invention, it is possible to achieve an improvement in the suppression of high-frequency interference signals on the input voltage.

Other features which are considered as characteristic for the invention are set forth in the appended claims.

Although the invention is illustrated and described herein as embodied in a circuit configuration and a method for the switch-on/off control of a field-effect transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
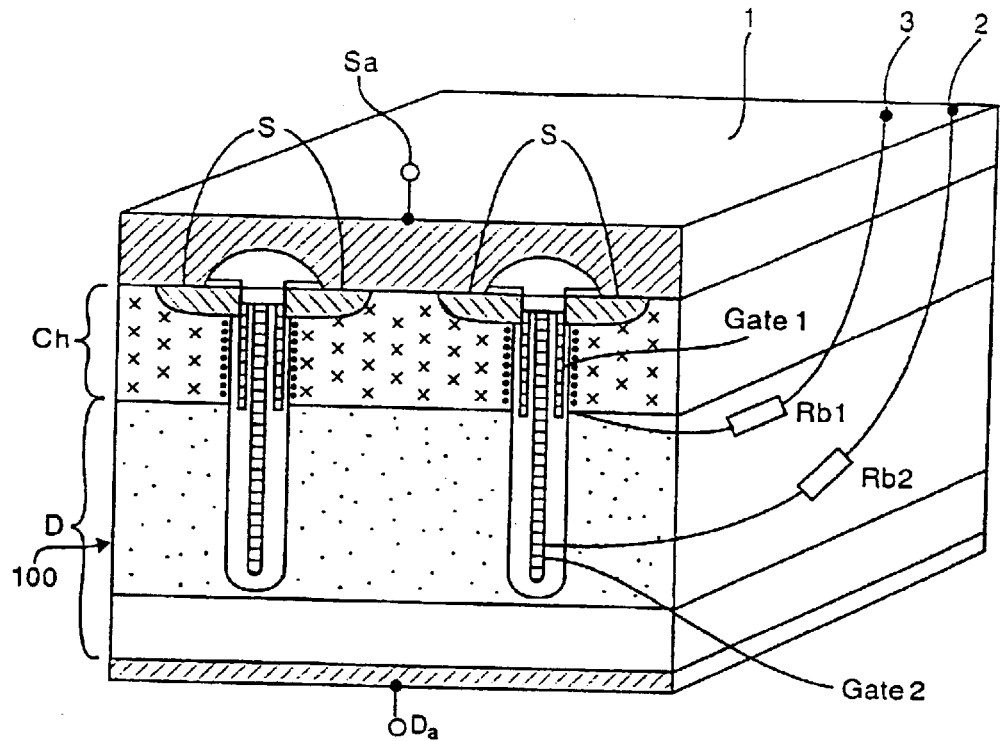
FIG. 1 is a diagrammatic, perspective, sectional view through a DMOS power transistor having two separate gate electrodes according to the invention.

Referring now to the figures of the drawing in detail and first, particularly, to FIG. 1 thereof, there is shown a DMOS power transistor 1 which is used in the case of the invention and in which a plurality of source regions S, a drain region D and two gate electrodes "Gate 1" and "Gate 2" per source region S are provided in a semiconductor body 100, the second gate electrode "Gate 2" of which gate electrodes extends right into the drain region D. The two gate electrodes "Gate 1" and "Gate 2" are composed of metal, for example of tungsten, or of polysilicon, and are insulated from the semiconductor body 100 and from one another by an insulating layer. The drain region D is connected to an external drain terminal Da via a metallization plane, and the source regions S are jointly connected to an external source terminal Sa via a metallization plane. The first and second gate electrodes "Gate 1" and "Gate 2" are in each case connected separately to external gate electrode terminals 2 and 3. Gate bulk resistances Rb1 and Rb2 are indicated, which are in each case caused by the connecting conductors between the (internal) gate electrodes "Gate 1" and "Gate 2" and the external electrode terminals 2 and 3 thereof.

The gate electrodes "Gate 1" and "Gate 2" are disposed in a deep vertical trench in the semiconductor body 100 in such a way that they are capacitively coupled to one another and that the coupling capacitance is distributed over the semiconductor body 100 or the chip of the DMOS power transistor. As a result, the coupling capacitance lies electrically closer to the MOSFET cells than the gate bulk resistances Rb1 and Rb2.

Figure 2:
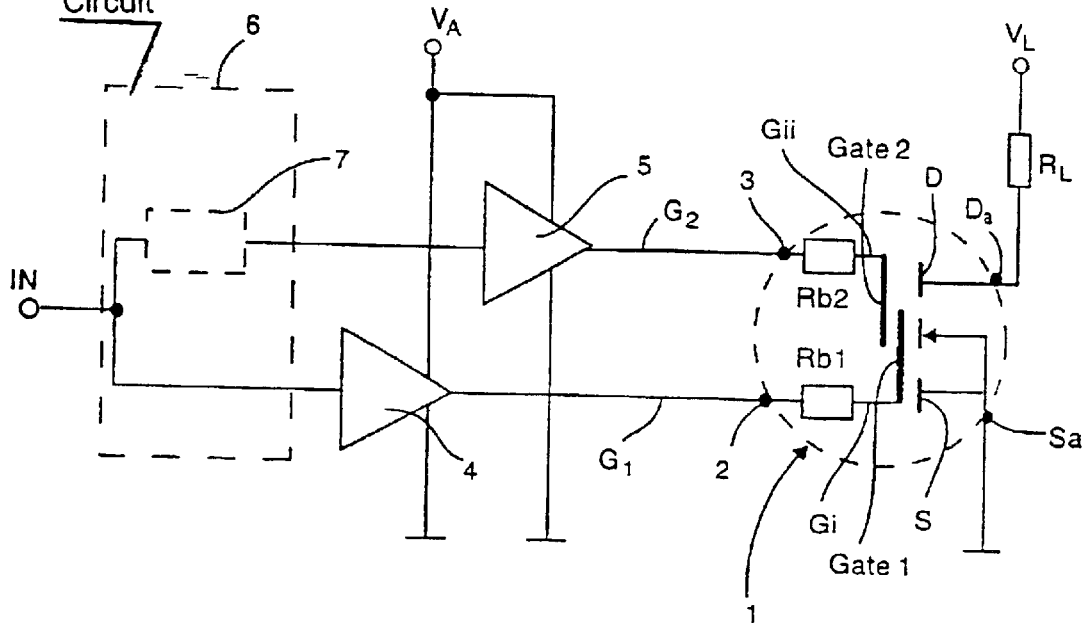
FIG. 2 is a circuit diagram of a first exemplary embodiment of a circuit configuration according to the invention that drives the DMOS power transistor illustrated as an equivalent circuit 10 diagram in accordance with FIG. 1.

FIG. 2 diagrammatically shows a first exemplary embodiment of a circuit configuration according to the invention for the switch-on/off control of the DMOS power transistor 1 shown in FIG. 1, which power transistor is symbolically illustrated by way of example as an N-channel MOSFET in FIG. 2. Clearly discernible are the two capacitively coupled gate electrodes "Gate 1" and "Gate 2" with their respective bulk resistances Rb1 and Rb2, the external gate electrode terminals 2 and 3, the drain region D with the external drain terminal Da, which is connected to a voltage $V_L$ in the load circuit via a load resistance $R_L$, and the source region S with the external source terminal Sa, which is directly connected to ground. By separate driver circuits 4 and 5, the two gate electrodes "Gate 1" and "Gate 2" are driven successively, respectively by the driver output signals designated by G1 and G2, which respectively become internal drive signals Gi and Gii at the gate electrode "Gate 1" and the gate electrode "Gate 2". The drivers 4 and 5 are fed from a common drive voltage $V_A$. The two driver circuits 4 and 5 receive their input signals separately from a generating circuit 6 which, in the exemplary embodiment shown in FIG. 2, contains a delay element 7 which causes a delay of the input signal fed to the second driver circuit 5 by a specific delay time $\tau$ with respect to the input signal IN fed to the first driver circuit 4. The delay element 7 is coordinated such that the driving of the second gate "Gate 2" begins if the internal gate voltage Gi of the first gate "Gate 1" has reached the Miller plateau. The circuit configuration can also readily be configured for a P-channel MOSFET transistor instead of for an N-channel MOSFET transistor.

Figure 3:
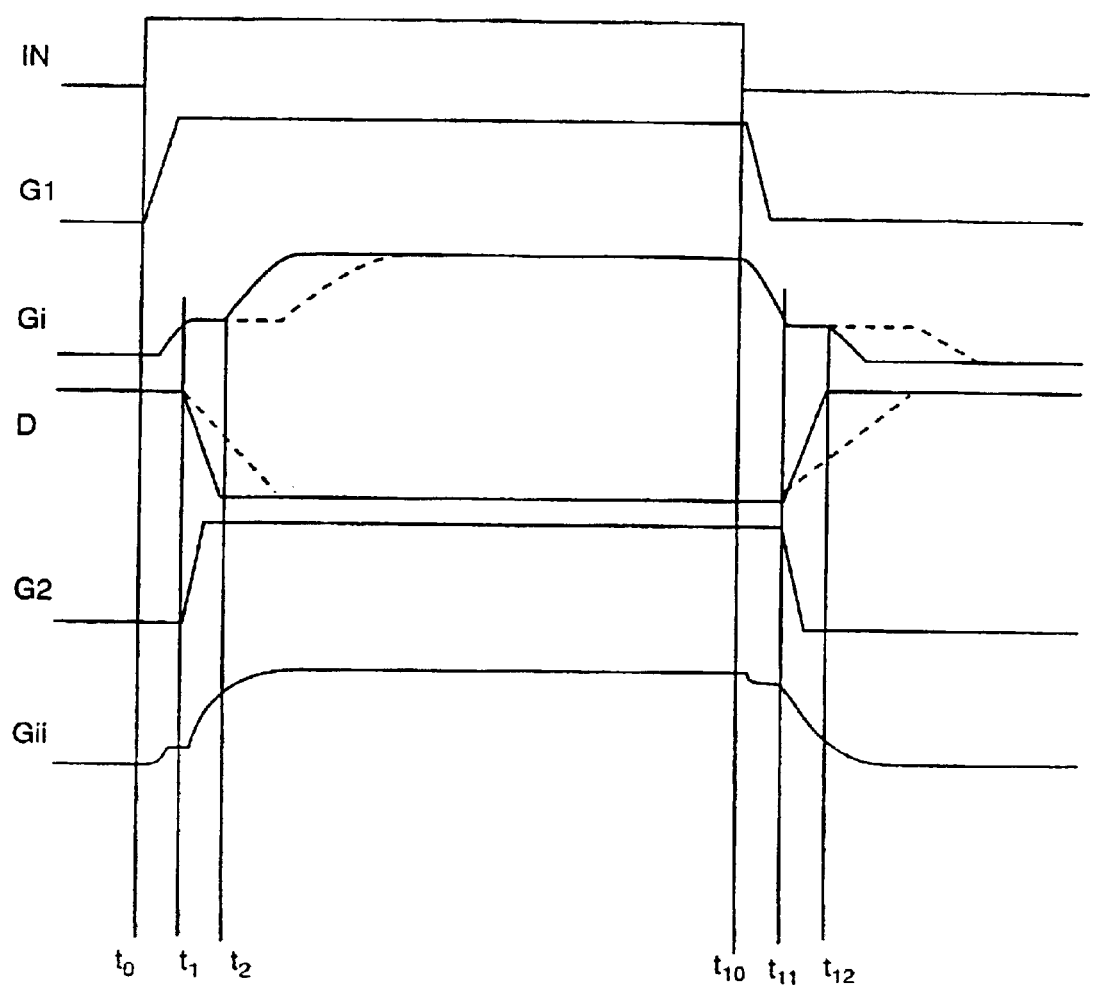
FIG. 3 is a pulse timing diagram illustrating temporal profiles of signals in accordance with FIG. 2.

The function of the circuit configuration in accordance with FIG. 2 will now be described in more detail in the pulse timing diagram illustrated in FIG. 3. The signals G1 and G2 respectively designate the output signals of the drivers 4 and 5 for driving the first gate "Gate 1" and the second gate "Gate 2", while the signals Gi and Gii designate the voltage profiles at the internal gate electrodes downstream of the bulk resistances Rb1, Rb2. The driver circuits 4 and 5 are assumed to be ideal in the signal profiles of FIG. 3. In the case of the signals Gi and D (drain voltage), the signal profile corresponding to the prior art is additionally indicated by dashes. The small staircase in the signal Gii at the beginning of each switching operation arises from the fact that the coupling capacitance (distributed over the chip of the MOS power transistor) is also charged by the charge reversal operation at Gate 1. The charging current generates a voltage drop across the bulk resistance Rb2 of Gate 2. The signal G1 amplified by the input signal IN first charges and discharges (instants t0 and t10) the first gate electrode "Gate 1", which forms the channel in the MOSFET. As soon as the drain voltage D begins to change at the instants t1 and t11, respectively, the voltage change of the signal Gi present at the (internal) first gate "Gate 1" slows down on account of the Miller effect. Starting from the instants t1 and t11, respectively, the charge reversal operation is supported by charging and discharging, respectively, of the second gate electrode "Gate 2" which is capacitively coupled to the first gate electrode (signal profile G2).

In contrast to the first gate electrode, in the case of which at most the difference between plateau voltage and drive voltage is available as a voltage drop across the gate bulk resistance Rb1, at the second gate "Gate 2" the entire drive voltage can still be utilized as a voltage drop across the bulk resistance Rb2 (see signal profile Gii). The unbroken signal profiles of the internal gate voltage Gi at the first gate "Gate 1" and of the drain voltage D clearly show, in comparison with the corresponding signal profiles of the prior art which are inserted in a dashed depiction, that, by virtue of the separate driving of the second gate "Gate 2", which is delayed with the signal G2, with respect to the signal G1, the Miller phase can be significantly reduced and the steepness of the edges of the drain voltage D can be significantly increased (see switch-on and -off instants t2 and t12). This leads to an increased operating frequency and to a reduction of the power loss of the DMOS power transistor driven by the circuit configuration according to the invention.

If, as in the Published, Non-Prosecuted German Patent Application DE 100 38 177 A cited above, the DMOS power transistor is advantageously configured in such a way that the second gate "Gate 2" shields at least part of the Miller capacitance from the first gate "Gate 1", the bulk resistance Rb1 of the first gate "Gate 1" is further relieved of the current flow during the switching operation.

Figure 4:
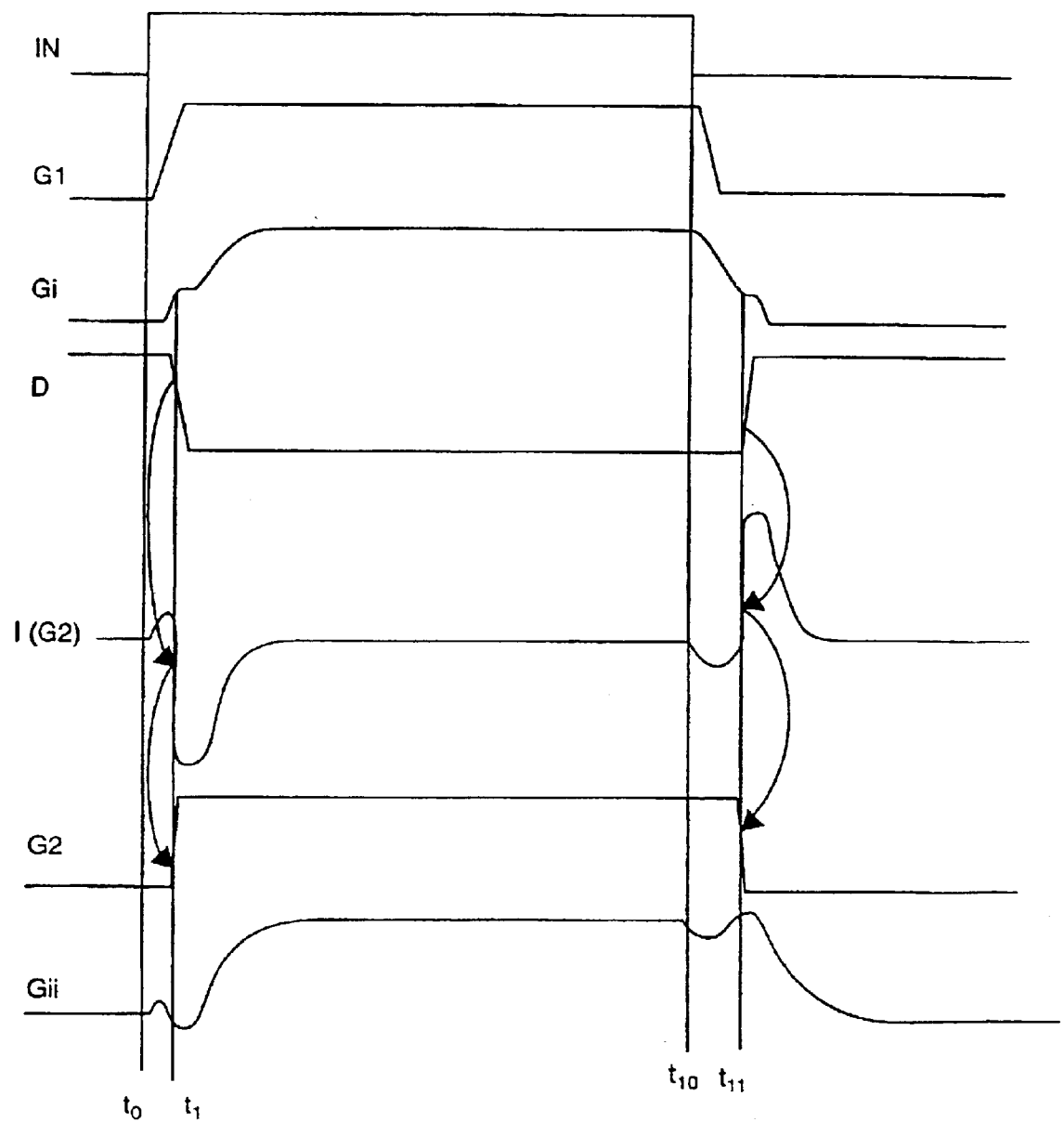
FIG. 4 is a pulse timing diagram illustrating signal profiles in a second exemplary embodiment of the invention.

This is illustrated in the upper part of the accompanying FIG. 4. The signal profile of the internal signal Gi present at the first gate electrode Gate 1 and shown in FIG. 4 and the voltage profile of the drain voltage D clearly show that the Miller phase can be shortened further with respect to FIG. 3 and the edge steepness of the voltage profile of the drain voltage can be increased further. Here, the voltage Gii at the second gate changes only after the Miller phase, that is to say, for the charge reversal of the Miller capacitance, the maximum gate current is available at the second gate "Gate 2" during the entire Miller phase.

A second exemplary embodiment of a circuit configuration according to the invention, which is likewise illustrated in FIG. 4, is based on this case, mentioned above, where the second gate "Gate 2" accepts a large part of the Miller capacitance. Here, the delay time between the drive signals G1 and G2 present at the first gate "Gate 1" and at the second gate "Gate 2" is configured adaptively either by a detection of the change in the gate current I(G2) at the second gate or by detection of the change in the drain voltage D. At the instants t1 and t11, in each case the negative edge of the drain voltage D is detected for switch-on and the positive edge of the drain voltage D is detected for switch-off and used in a trigger signal for the (delayed) triggering of the drive pulse G2 that is to be applied to the second gate "Gate 2". An alternative exemplary embodiment uses, as trigger event, the current flow I(G2) of the same polarity which is caused by the application of a high or low voltage to the first gate Gate 1 by virtue of the coupling capacitance at the second gate "Gate 2", if the second gate "Gate 2" is initially held at constant potential. If the drain voltage D then begins to change, the Miller effect commences and a current I(G2) with inverted sign flows at the second gate "Gate 2". This change in polarity may serve as a trigger event for triggering the switching edge of the drive signal G2 for the second gate "Gate 2" (instants t1 and t11 in FIG. 4).

Figure 5:
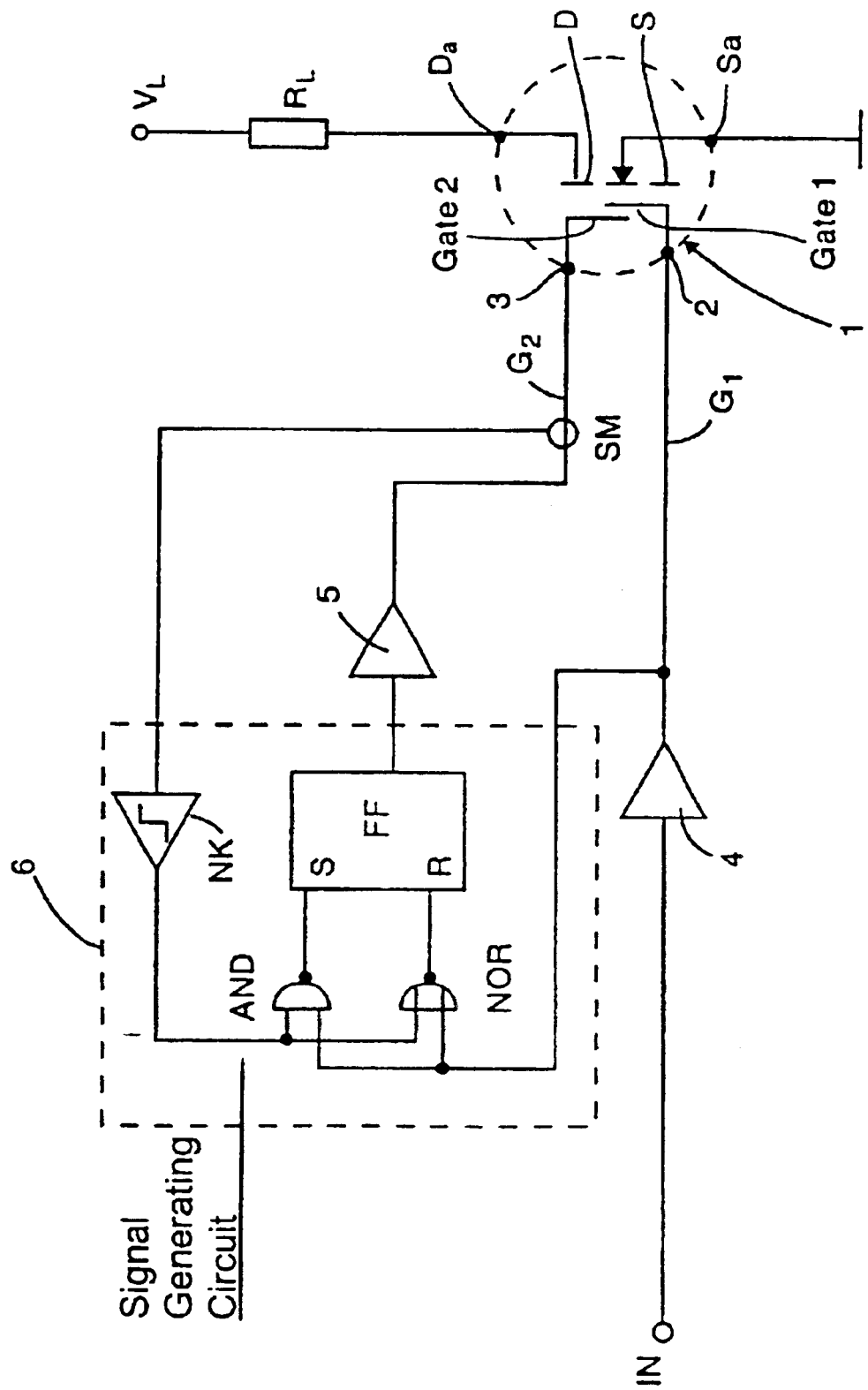
FIG. 5 is a circuit diagram of a second exemplary embodiment of the circuit configuration according to the invention.

The exemplary embodiment shown in FIG. 5 realizes the above method in which the second gate drive signal G2 is triggered by the current zero crossing of the current I(G2) at the second gate terminal "Gate 2". In the same way as in FIG. 2, the first gate electrode "Gate 1" is driven by the first gate driver 4. The second gate electrode "Gate 2" is initially held at a constant voltage by the second gate driver 5 until the current I(G2) measured at the output of the second gate driver 5 with the aid of a current measuring device SM changes polarity (at the instant t1). This change in polarity is indicated by a zero crossing comparator NK contained in the generating device 6, through a change in the logic level of its output signal. The logic levels at the output of the first gate driver 4 and of the zero crossing comparator NK are compared by logic elements AND and NOR contained in the generating device 6. In the case where the logic levels correspond, a flip-flop FF downstream of the logic elements AND and NOR is accordingly set. By way of example, if the field-effect transistor 1 is switched on and the output of the first gate driver 4 changes from "L" to "H", first of all a current flows from the second gate electrode "Gate 2" on account of the capacitive coupling between the gate electrodes. The current flow detected by the current measuring device SM is negative, the zero crossing comparator NK thereupon outputs a low level at its output, and the input signals of the logic elements AND and NOR are not identical. The state of the flip-flop FF is initially preserved and thus so, too, is the input level of the downstream second gate driver 5. It is only if the drain voltage D begins to fall at the instant t1 and the displacement current via the coupling capacitance between the drain and the second gate electrode "Gate 2" becomes greater than the displacement current via the capacitance between the first gate electrode Gate 1 and the second gate electrode Gate 2 that the current direction is reversed in the current measuring device SM and the output of the zero crossing comparator NK changes to "high". The input signals of the logic elements AND and NOR are then identical and the flip-flop FF is set. In response, the output of the second gate driver 5 likewise changes to "high" and supports the switch-on operation of the field-effect transistor 1.

The switch-off operation proceeds correspondingly. By tapping off the output signal of the first gate driver 4, it is ensured that the gate current I(G2) of the second gate already flows via the current measuring device SM if the input signal of the logic elements AND and NOR changes, and the output signal of the zero crossing comparator NK is thus unambiguous.

As an alternative to this, the input signal IN of the first gate driver 4 can also be applied to the logic elements AND and NOR. However, a delay element having approximately the delay of the first gate driver 4 must then be inserted into this signal path. As an alternative, the zero crossing comparator NK could be equipped with a sufficiently large hysteresis.

We claim:

1. A circuit configuration having a field-effect transistor, comprising:

a semiconductor body having a trench formed therein;

external gate terminals, including a first gate terminal and a second gate terminal;

at least one source electrode region formed in said semiconductor body;

at least one drain electrode region formed in said semiconductor body;

at least two gate electrodes, including a first gate electrode and a second gate electrode, formed vertically in said trench and in & manner insulated from one another and from said source electrode region and said drain electrode region, said first and second gate electrodes being capacitively coupled to one another by a capacitance distributed over the field-effect transistor, said gate electrodes each connected separately to one of said external gate terminals; and a driver configuration connected to said external gate terminals and having driver circuits, including a first driver circuit and a second driver circuit, and a generating device, said driver configuration generating a first gate drive signal passed to said first gate terminal, and a second gate drive signal passed to said second gate terminal, said generating device generating the second gate drive signal in a delayed manner with respect to the first gate drive signal.

2. The circuit configuration according to claim 1, wherein said generating device has a delay element, and a delay time of the second gate drive signal is brought about by said delay element and is defined for a specific field-effect transistor type.

3. The circuit configuration according to claim 1, wherein said generating device has a delay element, and a delay time of the second gate drive signal is brought about by said delay element and is defined in such a way that a driving of said second gate electrode brought about by the second gate drive signal begins if an internal gate voltage of said first gate electrode has just reached its Miller plateau.

4. The circuit configuration according to claim 1, wherein in a case where the field-effect transistor is configured in such a way that said second gate electrode accepts at least part of a Miller capacitance from said first gate electrode, the circuit configuration further comprising:

a detection device for detecting a current which is induced, when the first gate drive signal is applied to said first gate terminal, in said second gate electrode with an opposite polarity with respect to a current flow in said first gate electrode, said generating device, driven by said detection device, generating the second gate drive signal directly in response to the current detected at said second gate electrode.

5. The circuit configuration according to claim 1, wherein said generating device generates the first and second gate drive signals with rectangular waveforms.

6. The circuit configuration according to claim 1, wherein said generating device generates the first gate drive signal with a staircase waveform and the second gate drive signal with a rectangular waveform.

7. The circuit configuration according to claim 1, further comprising a housing, said first and second driver circuits and said generating device are integrated in said housing together with the field-effect transistor.

8. The circuit configuration according to claim 1, wherein the field-effect transistor is a power field-effect transistor.

* * * * *